(12) United States Patent
Schlenga

(10) Patent No.: US 7,464,556 B2
(45) Date of Patent: Dec. 16, 2008

(54) MAGNETIC RESONANCE APPARATUS WITH PHASE-ALIGNED COUPLING-IN OF WORKING GAS PRESSURE PULSES

(75) Inventor: Klaus Schlenga, Linkenheim-Hochstetten (DE)

(73) Assignee: Bruker Biospin GmbH, Rheinstetten (DE)

( * ) Notice: Subject to any disclaimer, the term of this patent is extended or adjusted under 35 U.S.C. 154(b) by 332 days.

(21) Appl. No.: 11/330,163

(22) Filed: Jan. 12, 2006

(65) Prior Publication Data

US 2006/0254288 A1 Nov. 16, 2006

(30) Foreign Application Priority Data

Jan. 29, 2005 (DE) ................. 10 2005 004 269

(51) Int. Cl.
*F25B 9/00* (2006.01)
*F25B 19/00* (2006.01)
(52) U.S. Cl. .............................. 62/6; 62/295
(58) Field of Classification Search .......... 62/6, 62/295
See application file for complete search history.

(56) References Cited

U.S. PATENT DOCUMENTS

| 5,582,013 | A | | 12/1996 | Neufeld |
| 5,744,959 | A | * | 4/1998 | Jeker et al. ............ 324/319 |
| 5,845,498 | A | | 12/1998 | Matsui |
| 5,966,944 | A | | 10/1999 | Inoue |
| 6,308,520 | B1 | * | 10/2001 | Inoue et al. .............. 62/6 |
| 6,629,418 | B1 | | 10/2003 | Gao |
| 2004/0045303 | A1 | * | 3/2004 | Chen et al. .............. 62/6 |

(Continued)

FOREIGN PATENT DOCUMENTS

GB 2 391 926 2/2004

OTHER PUBLICATIONS

Takayuki Tomara, Toshikazu Suzuki, Tomiyoshi Haruyama, Takakazu Shintomi, Akira Yamamoto, Tomohiro Koyama, Rui Li. "Vibration analysis of cryocoolers", Cryogenics 44 (2004) 309-317.

*Primary Examiner*—William C Doerrler
(74) *Attorney, Agent, or Firm*—Paul Vincent

(57) ABSTRACT

A magnetic resonance apparatus comprising a superconducting magnet coil disposed in a cryostat, and a refrigerator for cooling same comprising a compressor (1) for compressing a working gas, and a high-pressure line (2) and a low-pressure line (3) disposed between the compressor (1) and a control valve (5), which periodically connects the high-pressure line (2) and the low-pressure line (3) to at least one connecting line (6) between the control valve (5) and a cold head (4) of the refrigerator, thereby producing pressure pulses through the switched working gas, wherein the control valve (5) and/or connecting line (6) and cold head (4) components are rigidly mechanically coupled to the cryostat, is characterized in that at least one of the above-mentioned lines (2, 3, 6) is branched on the compressor side upstream of the rigidly coupled components, and is symmetrically joined at one of the coupled components in such a manner that the pressure pulses through the working gas are vectorially compensated for at the component where the branched line is joined, thereby minimizing vibrations of the cryostat. The inventive magnetic resonance apparatus greatly reduces transmission of oscillations to the magnet coil and thereby the number and strength of artefacts in the spectra or images acquired with this magnetic resonance apparatus, to ensure high-quality magnetic resonance recordings.

20 Claims, 3 Drawing Sheets

U.S. PATENT DOCUMENTS

2005/0028534 A1* 2/2005 Li et al. .......................... 62/6
2005/0126187 A1* 6/2005 Li et al. .......................... 62/6
2006/0277925 A1* 12/2006 Matsubara et al. ............... 62/6

* cited by examiner

MAGNETIC RESONANCE APPARATUS WITH PHASE-ALIGNED COUPLING-IN OF WORKING GAS PRESSURE PULSES

This application claims Paris Convention priority of DE 10 2005 004 269.4 filed Jan. 29, 2005 the complete disclosure of which is hereby incorporated by reference.

BACKGROUND OF THE INVENTION

The invention concerns a magnetic resonance apparatus comprising a superconducting magnet coil which is disposed in a cryostat, and a refrigerator for cooling the magnet coil, the refrigerator comprising a compressor for compressing a working gas, and with a high-pressure line and a low-pressure line disposed between the compressor and a control valve, wherein the control valve periodically connects the high-pressure line and the low-pressure line to at least one connecting line between the control valve and a cold head of the refrigerator, thereby generating pressure pulses through the connected working gas, wherein the control valve and/or connecting line and cold head components are rigidly mechanically coupled to the cryostat.

An arrangement of this type is disclosed in T. Tomaru et al. in Cryogenics 44, pages 309 to 317 (2004). The compressor is disposed outside of the cryostat and is connected to the control valve via the high-pressure line or the low-pressure line. The high-pressure line and the low-pressure line are designed as flexible hoses in order to reduce transmission of vibrations from the surroundings to the cryostat, in particular, to decouple the cryostat from the compressor. The control valve alternately connects high-pressure or low pressure in the form of working gas pressure pulses via the connecting line from one side to the cold head. This periodic changing-over of the control valve generates sinusoidal pressure impact which can result in undesired vibration of the components that are rigidly coupled to the cryostat (e.g. cold head of the refrigerator), or of the cryostat. The frequency distribution of the oscillations resulting from such an arrangement were analyzed by T. Tomaru et al. in Cryogenics 44, pages 309 to 317 (2004). The vibrations can lead to artefacts in the NMR signals.

It is therefore the underlying purpose of the invention to propose a magnetic resonance apparatus which realizes the supply of a working gas to a cold head using a compressor in such a manner that the artefacts in the NMR signals produced by the above-described vibrations are minimized.

SUMMARY OF THE INVENTION

This object is achieved in accordance with the invention in that at least one of the above-mentioned lines is branched on the compressor side, upstream of the rigidly coupled components and is symmetrically joined at one of the coupled components in such a manner that the pressure pulses through the working gas are vectorially compensated for at the component where the branched line is joined, thereby minimizing vibrations of the cryostat.

The corresponding line is branched into line sections in a region which is not rigidly connected to the cryostat, while the branched line is joined at one component or one point which is rigidly coupled to the cryostat. The corresponding components are thereby "rigidly" coupled to the cryostat relative to the oscillating frequencies to be transmitted due to the pressure fluctuations in the working gas, which are on an order of magnitude of approximately 1 Hz. Due to the symmetrical joining of the branched lines, the pressure pulses can be coupled in a phase-aligned manner, thereby compensating for the pressure waves.

The cryostat and the magnet coil are preferably disposed in such a manner that they are isolated from ambient oscillations. The transmission of vibrations from the surroundings to the magnet coil can be minimized by the flexible design of the high-pressure and low-pressure lines.

In one embodiment of the inventive magnetic resonance apparatus, the high-pressure line and/or the low-pressure line are branched and are each joined again at the turning valve which is rigidly mechanically coupled to the cryostat. They may be symmetrically joined e.g. by selecting individual line sections of the branched lines of the same length which terminate at opposite points in the control valve where the pressure pulses overlap.

In an alternative embodiment of the inventive magnetic resonance apparatus, the connecting line is branched and joined again at the cold head which is rigidly mechanically coupled to the cryostat. As in the above-mentioned embodiment, the pressure pulses can also be joined with aligned phases.

Alternatively, the connecting line may be branched and joined again at a joining point upstream of the cold head, wherein the joining point is rigidly mechanically coupled to the cryostat.

The branching is preferably divided into n line sections and the line sections are joined in the shape of a star. In the simplest case, n=2 and the line sections are joined at an angle of 180°, i.e. at opposite points of the corresponding component.

The individual line sections of the branched lines may have the same length for phase-aligned joining. It is, however, also feasible to provide a phase shifter in at least one of the n line sections, which delays the pressure pulses through the working gas in the corresponding line sections in such a manner that the pressure pulses of the n line sections are coupled-in with aligned phases. In this case, phase-aligned coupling of the pressure pulses can be realized despite different line section lengths.

One special embodiment of the inventive magnetic resonance apparatus provides several control valves and several connecting lines to the cold head, wherein either each individual branched line section pair or all connecting lines are symmetrically joined together.

In one particularly simple further development of this embodiment, the control valves are disposed symmetrically with respect to the cold head.

In one further development of the inventive magnetic resonance apparatus, the control valves are synchronized, permitting particularly exact overlapping of the pressure pulses to prevent partial elimination of the pulse waves.

In one preferred embodiment of the inventive magnetic resonance apparatus, the control valve is a turning valve.

With particular preference, the refrigerator is a pulse tube cooler comprising at least one stage, since pulse tube coolers can be operated with particularly low vibration.

The inventive magnetic resonance apparatus is preferably designed for high-resolution NMR measurements. Since these measurements require excellent vibration decoupling, the present invention can be used with particular advantage for this purpose.

The inventive magnetic resonance apparatus can be used in an advantageous manner, in particular, when it is designed for imaging using magnetic resonance methods.

Further advantages of the invention can be extracted from the description and the drawing. The features mentioned above and below can be used individually or collectively in arbitrary combination. The embodiments shown and described are not to be understood as exhaustive enumeration but have exemplary character for describing the invention.

DESCRIPTION OF THE PREFERRED EMBODIMENT

Figure 3:
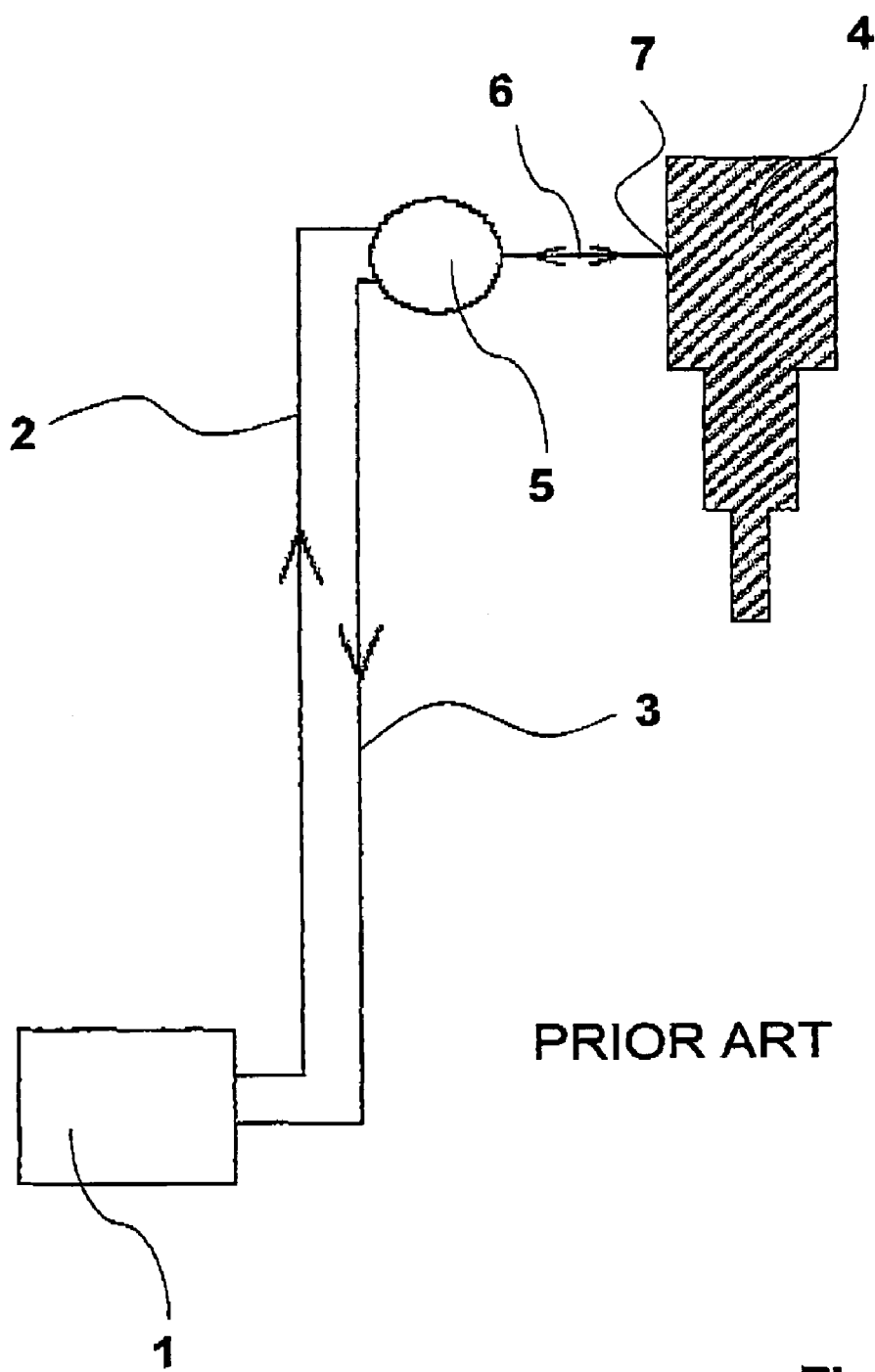
FIG. 3 shows a refrigerator of a magnetic resonance apparatus in accordance with prior art.

FIG. 3 shows a refrigerator of a conventional magnetic resonance apparatus. A compressor 1 supplies or discharges a working gas into or from a cold head 4 of the refrigerator via a high-pressure line 2 and a low-pressure line 3. The supply of the working gas is controlled by a control valve 5 which alternately connects high-pressure or low-pressure to the cold head 4 via a connecting line 6. The connecting line 6 terminates in the cold head 4 at a supply point 7. The pressure wave of the working gas supplied to the cold head 4 transmits vibrations to the cold head 4 at the supply point 7. The magnet coil, the cryostat, the cold head 4 and possibly additional components are disposed such that they are isolated from vibrations from the surroundings and are rigidly interconnected, thereby forming a system which is isolated from vibrations from the surroundings. For this reason, the vibrations introduced into the cold head 4 also act on the magnet coil and correspondingly affect measurements produced with this magnet coil.

Figure 1:
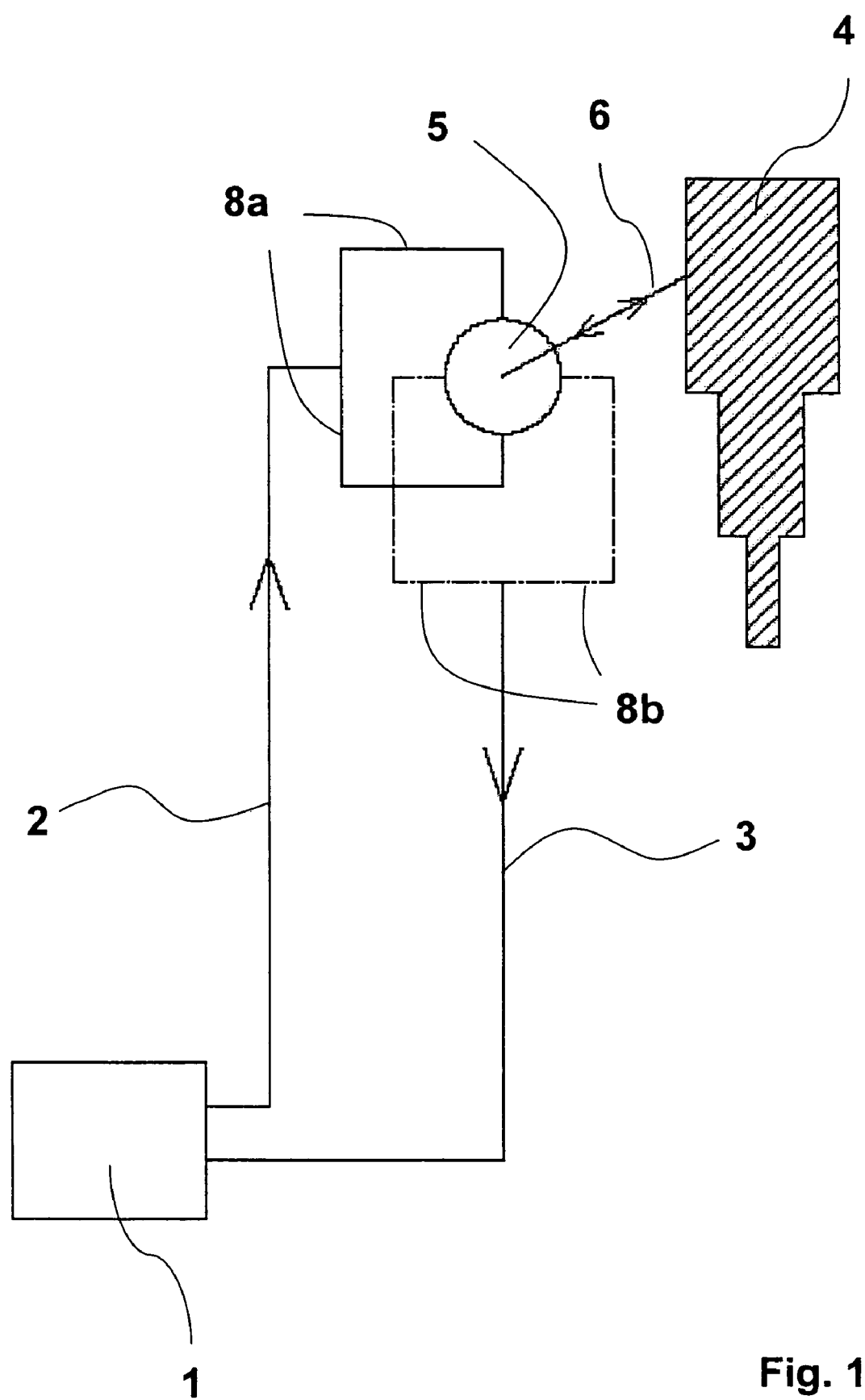
FIG. 1 shows a refrigerator of an inventive magnetic resonance apparatus with branched high-pressure line and low-pressure line.

To prevent or at least reduce transmission of vibrations of the working gas pressure wave, one of the lines 2, 3, 6 of the inventive magnetic resonance apparatus is bifurcated and joined again at a suitable location. FIG. 1 shows a possible embodiment, wherein both the high-pressure line 2 and the low-pressure line 3 are bifurcated into two line sections 8a and 8b, each of which is joined again at the control valve 5. In this case, the control valve 5 must be rigidly coupled to the cryostat relative to the oscillating frequencies transmitted by the working gas, and therefore be part of the system which is isolated from the vibrations of the surroundings and which may oscillate relative to the surrounding, wherein, however, the components of the system are rigidly interconnected. The pressure pulses introduced into the control valve 5 are compensated for in the inventive magnetic resonance apparatus through phase-aligned coupling of the pressure pulses into the control valve 5. This is realized by bifurcating each of both the high-pressure line 2 and the low-pressure line 3 into two line sections 8a, 8b of the same length, which are joined again at the control valve 5 at an angle of 180°.

Figure 2:
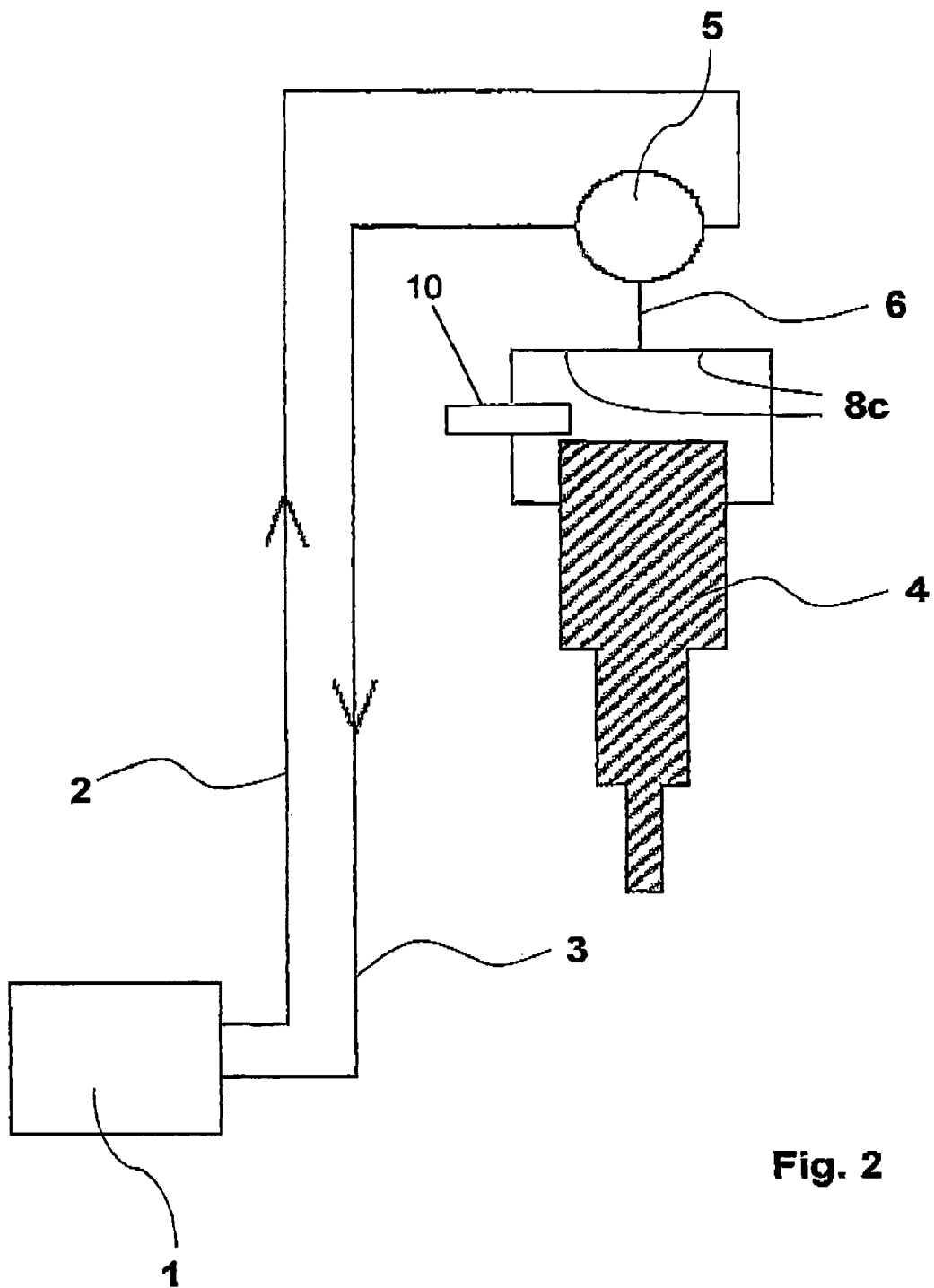
FIG. 2 shows a refrigerator of an inventive magnetic resonance apparatus with branched connecting line.

FIG. 2 shows an alternative possibility of phase-aligned coupling-in of the pressure pulses into the cold head 4. The control valve 5 is thereby not part of the system which is isolated from vibrations of the surroundings, and is therefore not rigidly coupled to the cryostat. The high-pressure line 2 and the low-pressure line 3 extend as in conventional magnetic resonance apparatuses. Only the connecting line 6 between the control valve 5 and the cold head 4 is bifurcated into two line sections 8c which are symmetrically joined at the cold head 4. The example of FIG. 2 also realizes phase-aligned coupling-in of the pressure pulses through bifurcating the line 6 into two line sections 8c having the same length and joining them at an angle of 180°. If required, one of the two line sections 8c can have a phase shifter 10 which delays pressure pulses through the working gas in that line section to effect phase-aligned coupling-in of said pressure pulses in the two line sections 8c.

It is, however, also feasible to bifurcate the corresponding lines into several line sections. It is also possible to integrate phase shifters in the line sections to compensate for different line section lengths.

Moreover, the line sections can be joined at one joining point within the bifurcated line as long as this joining point is part of the system which is isolated from oscillations from the surroundings, i.e. is rigidly coupled to the cryostat.

The inventive magnetic resonance apparatus greatly reduces the transmission of oscillations to the magnet coil and therefore the number and strength of artefacts in the spectra or images acquired with this magnetic resonance apparatus to ensure high quality magnetic resonance recordings.

LIST OF REFERENCE NUMERALS 1 compressor
2 high-pressure line
3 low-pressure line
4 cold head
5 control valve
6 connecting line
7 supply point
8a line sections of the high-pressure line
8b line sections of the low-pressure line
8c line sections of the connecting line
10 phase shifter.

I claim:

1. A magnetic resonance apparatus comprising:
   a cryostat;
   a superconducting magnet coil disposed in said cryostat; and
   a refrigerator for cooling at least one of said cryostat and said magnet coil, said refrigerator having a compressor for compressing a working gas, a cold head, a control valve, a high pressure line disposed between said compressor and said control valve, a low pressure line disposed between said compressor and said control valve, and at least one connecting line disposed between said control valve and said cold head, wherein said control valve periodically connects said high pressure line and said low pressure line to said connecting line to produce pressure pulses through the working gas, wherein said control valve is rigidly mechanically coupled to said cryostat and at least one of said high pressure line and said low pressure line is branched on a compressor side upstream of said control valve and is symmetrically joined at said control valve such that pressure pulses through the working gas are vectorially compensated for at said control valve to minimize vibrations of said cryostat.

2. The magnetic resonance apparatus of claim 1, wherein said cryostat and said magnet coil are isolated from ambient vibrations.

3. A magnetic resonance apparatus comprising:
   a cryostat;
   a superconducting magnet coil disposed in said cryostat; and
   a refrigerator for cooling at least one of said cryostat and said magnet coil, said refrigerator having a compressor for compressing a working gas, a cold head, a control valve, a high pressure line disposed between said compressor and said control valve, a low pressure line disposed between said compressor and said control valve, and at least one connecting line disposed between said control valve and said cold head, said control valve periodically connecting said high pressure line and said low pressure line to said connecting line to produce pressure pulses through the working gas, wherein said connecting line is branched and is symmetrically joined at a junction region which is rigidly mechanically connected to said cryostat such that pressure pulses through the working gas are vectorially compensated for at said junction region to minimize vibrations of said cryostat.

4. The magnetic resonance apparatus of claim 3, wherein said junction region is disposed on said cold head, said cold head being rigidly mechanically coupled to said cryostat.

5. The magnetic resonance apparatus of claim 3, wherein said junction region is disposed upstream of said cold head.

6. The magnetic resonance apparatus of claim 1, wherein each of said branched high and low pressure lines are divided into n line sections, and said line sections are joined in a form of a star.

7. The magnetic resonance apparatus auf claim 6, wherein, n=2, and said line sections are joined at an angle of 180°.

8. The magnetic resonance apparatus of claim 6, wherein at least one of said n line sections is provided with a phase shifter which delays pressure pulses through the working gas in a corresponding line section to effect phase-aligned coupling-in of said pressure pulses of the n line sections.

9. The magnetic resonance apparatus of claim 1, further comprising several control valves and several connecting lines to said cold head, wherein either one individual branched line section pair or all connecting lines are symmetrically joined together.

10. The magnetic resonance apparatus of claim 9, wherein said control valves are disposed symmetrically relative to said cold head.

11. The magnetic resonance apparatus of claim 9, wherein said control valves are synchronized.

12. The magnetic resonance apparatus of claim 1, wherein said control valve is a turning valve.

13. The magnetic resonance apparatus of claim 3, wherein said cryostat and said magnet coil are isolated from ambient vibrations.

14. The magnetic resonance apparatus of claim 3, wherein said branched connecting line is divided into n line sections, and said line sections are joined in a form of a star.

15. The magnetic resonance apparatus auf claim 3, wherein, n=2, and said line sections are joined at an angle of 180°.

16. The magnetic resonance apparatus of claim 3, wherein at least one of said n line sections is provided with a phase shifter which delays pressure pulses through the working gas in a corresponding line section to effect phase-aligned coupling-in of said pressure pulses of the n line sections.

17. The magnetic resonance apparatus of claim 3, further comprising several control valves and several connecting lines to said cold head, wherein either one individual branched line section pair or all connecting lines are symmetrically joined together.

18. The magnetic resonance apparatus of claim 17, wherein said control valves are disposed symmetrically relative to said cold head.

19. The magnetic resonance apparatus of claim 17, wherein said control valves are synchronized.

20. The magnetic resonance apparatus of claim 3, wherein said control valve is a turning valve.

* * * * *